(12) United States Patent
Leipold et al.

(10) Patent No.: US 10,298,186 B2
(45) Date of Patent: May 21, 2019

(54) DIVERSITY RECEIVE MODULES USING ONE OR MORE SHARED TUNABLE NOTCH FILTERS FOR TRANSMIT BLOCKER REJECTION

(71) Applicant: RF Micro Devices, Inc., Greensboro, NC (US)

(72) Inventors: Dirk Robert Walter Leipold, San Jose, CA (US); George Maxim, Saratoga, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 144 days.

(21) Appl. No.: 14/931,102

(22) Filed: Nov. 3, 2015

(65) Prior Publication Data

US 2016/0126990 A1    May 5, 2016

Related U.S. Application Data

(60) Provisional application No. 62/074,432, filed on Nov. 3, 2014.

(51) Int. Cl.
*H04W 4/00* (2018.01)
*H03F 3/193* (2006.01)
(Continued)

(52) U.S. Cl.
CPC ........... *H03F 3/193* (2013.01); *H03F 1/0261* (2013.01); *H03F 1/223* (2013.01); *H03F 1/26* (2013.01); *H04B 1/1036* (2013.01); *H04B 7/08* (2013.01); *H04W 72/04* (2013.01); *H03F 2200/294* (2013.01); *H03F 2200/451* (2013.01); *H03F 2200/492* (2013.01); *H04B 2001/1063* (2013.01)

(58) Field of Classification Search
CPC ........ H03F 3/193; H03F 1/0261; H03F 1/223; H03F 1/26; H03F 2200/294; H04B 1/1036; H04B 7/08; H04B 1/109; H04B 1/525; H04B 2001/1063; H04W 72/04
See application file for complete search history.

(56) References Cited

U.S. PATENT DOCUMENTS

2014/0185498 A1* 7/2014 Schwent ............... H04B 1/0057
370/297
2014/0194074 A1* 7/2014 Klomsdorf ........... H04B 1/0458
455/77

(Continued)

*Primary Examiner* — Abdelnabi O Musa
(74) *Attorney, Agent, or Firm* — Withrow & Terranova, P.L.L.C.

(57) ABSTRACT

A carrier aggregation front-end module with a receive sub-module for receiving signals from a plurality of transmit modules. The module comprises a first receive path configured to receive a first set of signals from one or more of a plurality of antennas, wherein the first set of signals comprises at least one desired receive signal and at least one undesired transmit blocker signal from the plurality of transmit modules. The second receive path is configured to receive a second set of signals from one or more of a plurality of antennas comprising at least one desired receive signal and at least one undesired transmit blocker signal from the plurality of transmit modules. The module also comprises at least one shared tunable notch filter configured to reject at least one of the undesired transmit blocker signals for each of the first receive path and the second receive path.

20 Claims, 8 Drawing Sheets

(51) Int. Cl.
*H03F 1/26* (2006.01)
*H04B 1/10* (2006.01)
*H04B 7/08* (2006.01)
*H04W 72/04* (2009.01)
*H03F 1/02* (2006.01)
*H03F 1/22* (2006.01)

(56) References Cited

U.S. PATENT DOCUMENTS

2015/0236798 A1* 8/2015 Nobbe .................. H04B 17/12
370/278
2015/0358041 A1* 12/2015 Li ....................... H04B 1/1036
455/188.1

* cited by examiner

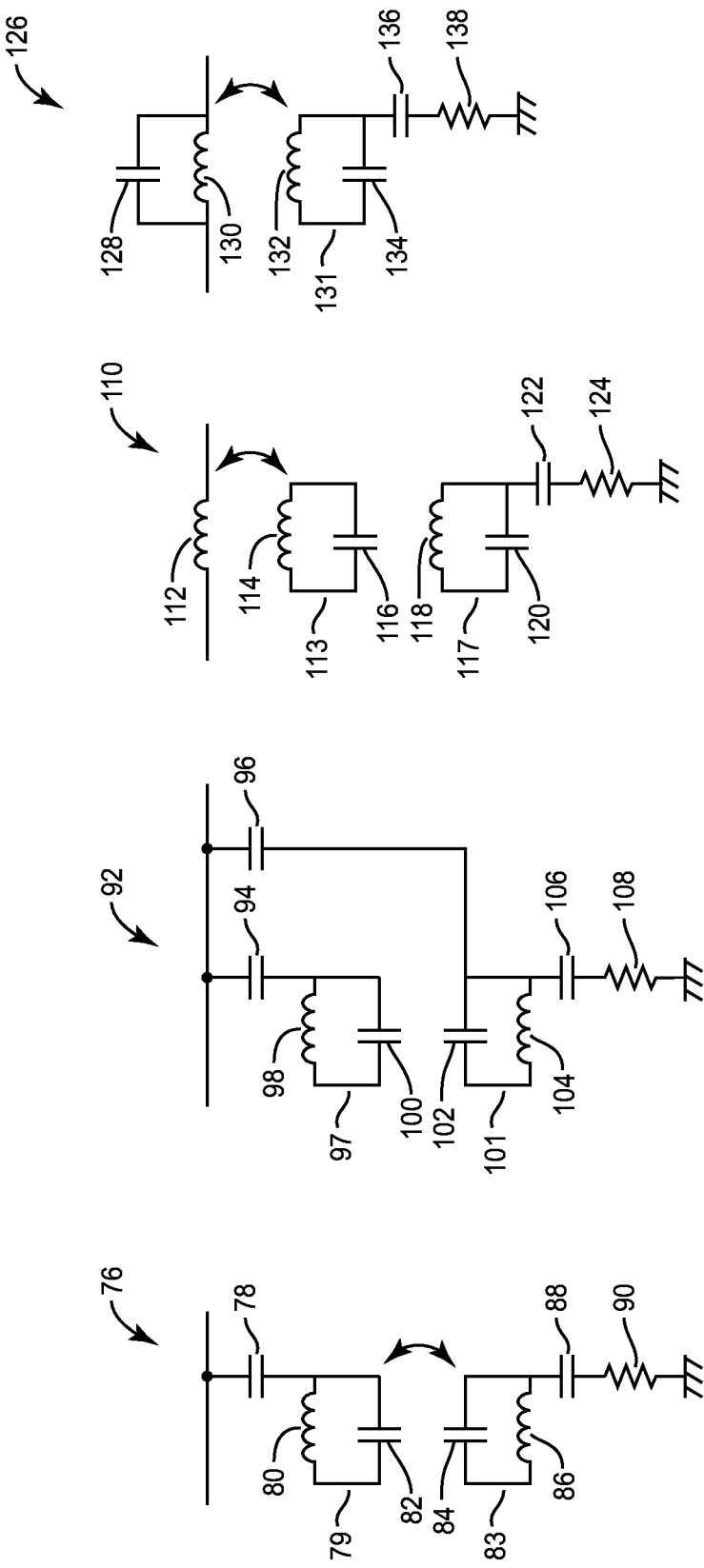

DIVERSITY RECEIVE MODULES USING ONE OR MORE SHARED TUNABLE NOTCH FILTERS FOR TRANSMIT BLOCKER REJECTION

RELATED APPLICATIONS

This application claims the benefit of U.S. provisional patent application No. 62/074,432, filed Nov. 3, 2014, entitled "DIVERSITY DRX MODULES," the disclosure of which is hereby incorporated herein by reference in its entirety.

FIELD OF THE DISCLOSURE

The present disclosure relates to receive modules, and specifically to carrier aggregation diversity receive modules for use in a mobile device.

BACKGROUND

In order to exploit the available frequency spectrum more efficiently, current wireless communication standards require a tight arrangement of communication channels in the frequency domain. As a result, transmit energy from a nearby transmitter (which may be referred to as a transmit blocker signal) can interfere with the receive signal due to the proximity of the transmit antenna to one or more receive antennas. While in particular current digital signal processing techniques exist that enable receivers to filter out a desired signal from a relatively strong noise floor (i.e., a relatively low signal-to-noise (SNR) ratio), a so-called blocker signal, interferer signal, or interference signal that is at a nearby frequency and has a signal level comparable to or even higher than the desired signal, poses a challenge to most receiver structures. In particular, a receiver module needs to process the transmit locker signal and the desired signal with relatively high fidelity, so that the transmit blocker signal may be separated from the desired signal Carrier aggregation diversity receive (DRX) modules need to have two or more signal paths active at the same time. Traditional carrier aggregation DRX modules use individual receive filters to reject the transmit blocker for each receive path. This approach results in high complexity filters for each path, which leads to higher costs and a larger size for the DRX modules.

It would be desirable to have a DRX module that rejects the transmit blocker for all diversity RX paths simultaneously, while reducing the complexity, size, and costs of the DRX module. Further, it is important to maintain a reasonable quality (Q) actor and provide sizeable band-pass rejection, while still keeping noise low. It would be beneficial to have high transmit blocker rejection and low insertion loss impact in the pass-band filters. It would also be beneficial to have tunability and the ability to cover several adjacent bands so that a wide variety of channel carrier aggregation combinations can be addressed with a small hardware infrastructure.

The present disclosure describes a receive module infrastructure that significantly reduces the complexity, size, and cost of the receive module, while giving reasonable Q factor in matching networks and providing sizeable band-pass rejection, and keeping the noise contribution of the low noise amplifiers (LNAs) low. The proposed receive module infrastructure provides high transmit blocker rejection and low insertion loss impact in the pass-band filters. The proposed receive module infrastructure can address a wide variety of channel carrier aggregation combinations with a small hardware infrastructure.

SUMMARY

A carrier aggregation front-end module with a receive sub-module for receiving signals from a plurality of transmit modules in a carrier aggregation system is disclosed. The module comprises a first receive path configured to receive a first set of signals from one or more of a plurality of antennas, wherein the first set of signals comprises at least one desired receive signal and at least one undesired transmit blocker signal. The second receive path is configured to receive a second set of signals from one or more of a plurality of antennas, wherein the second set of signals comprises at least one desired receive signal and at least one undesired transmit blocker signal from the plurality of transmit modules. The module also comprises at least one shared tunable notch filter configured to reject at least one of the undesired transmit blocker signals for each of the first receive path and the second receive path. In this manner, the at least one shared tunable notch filter is configured to reject at least one of the undesired transmit blocker signals for all, or a subset of, the receive paths at the same time without having to have complex filters in each of the receive paths. The sharing of the tunable notch filter significantly reduces the complexity, size, and cost of the receive sub-module.

In another embodiment, a system for providing carrier aggregation is disclosed. The system comprises a plurality of transmit modules. Each of the plurality of transmit modules is associated with a main antenna and is configured to transmit one or more transmit signals via its associated main antenna. The one or more transmit signals comprise at least one undesired transmit blocker signal. The system also comprises a diversity antenna configured to receive the one or more transmit signals from the plurality of transmit modules. The system further comprises a receive sub-module configured to receive one or more transmit signals from the plurality of the transmit modules. The receive sub-module comprises a first receive path configured to receive a first set of signals from the diversity antenna, wherein the first set of signals comprises at least one desired receive signal and at least one undesired transmit blocker signal from the plurality of transmit modules. The second receive path is configured to receive a second set of signals from the diversity antenna, wherein the second set of signals comprises at least one desired receive signal and at least one undesired transmit blocker signal from the plurality of transmit modules. The receive sub-module also comprises at least one shared tunable notch filter configured to reject at least one of the undesired transmit blocker signals for each of the first receive path and the second receive path. In this manner, the at least one shared tunable notch filter is configured to reject at least one of the undesired transmit blocker signals for all, or a subset of, the diversity receive paths at the same time without having to have complex filters in each of the receive paths. The sharing of the tunable notch filter significantly reduces the complexity, size, and cost of the receive sub-module.

In one embodiment, the disclosed module may be used in a system with any number of main antennas and diversity antennas and also to antennas having multiple feed ports.

In one embodiment, the receive sub-module may also comprise a LNA for each receive path, and an optional individual matching network for each LNA. Using high impedance matching into the LNAs gives reasonable Q in the matching networks and thus provides sizeable band-pass rejection, while keeping the noise contribution of the LNAs low.

In one embodiment, the at least one shared tunable notch filter may be implemented at an input of the LNA. In an alternate embodiment, the at least one shared tunable notch filter may be implemented at an output of the LNA.

In another embodiment, the at least one shared tunable notch filter can be implemented with a weakly-coupled LC resonator. This weakly-coupled LC resonator may result in high transmit blocker rejection and low insertion loss impact in the LNA pass-band due to the negligible reflectivity of the weakly-coupled filters. In addition, the weakly-coupled nature of the filter ensures a very low level of interaction between the transmit notch and the pass-band filtering section of the filters, allowing a wide range tunability of each component.

In another embodiment, the matching network(s) may be tunable band-pass LNA matching networks. These tunable band-pass LNA matching networks can cover several adjacent bands.

By using the proposed at least one shared tunable notch filter, alone or with the proposed tunable band-pass LNA matching network(s), the disclosed receive sub-module can address a wide variety of channel carrier aggregation combination with a small hardware infrastructure.

The proposed receive sub-module with at least one shared tunable notch filter can be used in systems supporting up-link carrier aggregation with two or more transmit signals active at a given time, where there are MIMO (multiple input and multiple output) antennas—that is, multiple transmit and receive antennas are used for sending and receiving more than one data signal on the same radio channel at the same time via multipath propagation.

Those skilled in the art will appreciate the scope of the present disclosure and realize additional aspects thereof after reading the following detailed description in association with the accompanying drawings.

BRIEF DESCRIPTION OF THE DRAWINGS

The accompanying drawing figures incorporated in and forming a part of this specification illustrate several aspects of the disclosure, and together with the description serve to explain the principles of the disclosure.

FIG. 4A illustrates an exemplary embodiment of an LC tunable notch filter that is capacitive coupled.

FIG. 4B illustrates an exemplary embodiment of an LC tunable notch filter that is multi-capacitive coupled.

FIG. 4C illustrates an exemplary embodiment of an LC tunable notch filter that is inductive coupled.

FIG. 4D illustrates an exemplary embodiment of an LC tunable notch filter that is resonant coupled.

DETAILED DESCRIPTION

A carrier aggregation front-end module with a receive sub-module for receiving signals from a plurality of transmit modules in a carrier aggregation system is disclosed. The module comprises a first receive path configured to receive a first set of signals from one or more of a plurality of antennas, wherein the first set of signals comprises at least one desired receive signal and at least one undesired transmit blocker signal. The second receive path is configured to receive a second set of signals from one or more of a plurality of antennas, wherein the second set of signals comprises at least one desired receive signal and at least one undesired transmit blocker signal from the plurality of transmit modules. The module also comprises at least one shared tunable notch filter configured to reject at least one of the undesired transmit blocker signals for each of the first receive path and the second receive path. In this manner, the at least one shared tunable notch filter is configured to reject at least one of the undesired transmit blocker signals for all, or a subset of, the diversity receive paths at the same time without having to have complex filters in each of the receive paths. The sharing of the tunable notch filter significantly reduces the complexity, size, and cost of the receive sub-module.

In one embodiment, the receive sub-module may also comprise a LNA for each receive path, and an optional individual matching network for each LNA. Using high impedance matching into the LNAs gives reasonable Q in the matching networks and thus provides sizeable band-pass rejection, while keeping the noise contribution of the LNAs low.

By using the proposed at least one shared tunable notch filter, alone or with the proposed tunable band-pass LNA matching network(s), the disclosed receive sub-module can address a wide variety of channel carrier aggregation combinations with a small hardware infrastructure.

Figure 1A:
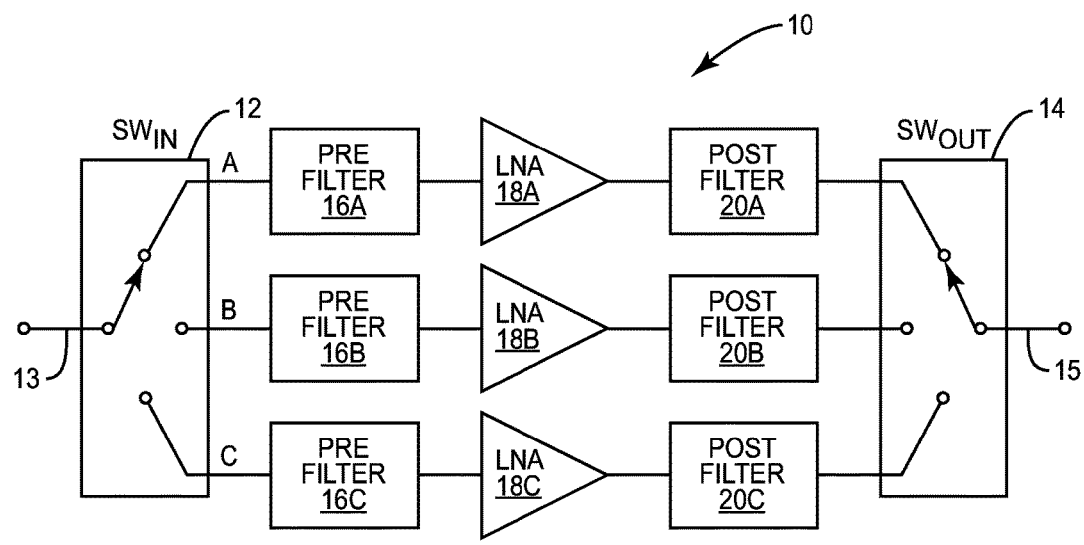
FIG. 1A illustrates an example of a non-carrier-aggregation DRX module, for 2-CA systems.

Before discussing the disclosed receive sub-module infrastructure, a brief discussion of traditional DRX modules is provided for background purposes. Referring now to FIG. 1A, an example of a non-carrier-aggregation DRX module 10 for 2-CA systems is shown. In this example, a first receive signal comes from a main antenna and a second receive signal comes from a diversity antenna. The non-carrier-aggregation DRX module 10 has an input switch 12 with an input 13, as well as an output switch 14 with an output 15. The input switch 12 may be a band select switch that selects one of the three switched DRX paths A, B, and C, such that only one path is active at a time. Each path comprises a pre-filter, a LNA, and a post-filter, such that path A includes pre-filter 16A, LNA 18A, and post-filter 20A; path B includes pre-filter 16B, LNA 18B, and post-filter 20B; and path C includes pre-filter 16C, LNA 18C, and post-filter 20C. The input switch 12 before the LNA degrades noise figure (NF). The post-LNA output switch 14 has much less impact on the NF.

Figure 1B:
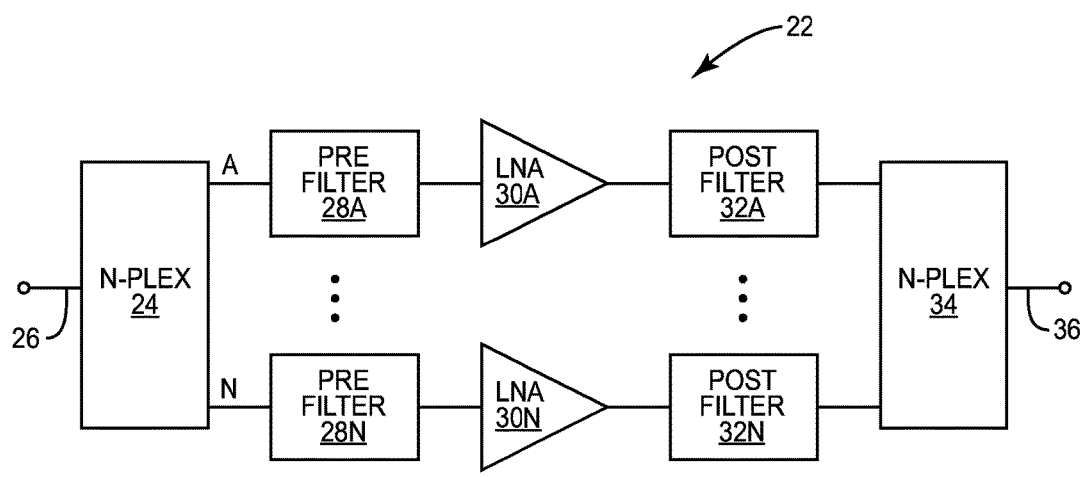
FIG. 1B illustrates an example of a carrier aggregation DRX module.

Now referring to FIG. 1B, an example of a carrier-aggregation DRX module 22 is shown, which can process simultaneously multiple receive signals. The carrier-aggregation DRX module 22 has a number N of multiplexed DRX paths (N paths). Because each of the N paths may be active, and at any specific time, two or more of the N paths may be active, the carrier-aggregation DRX module 22 requires a demultiplexer 24 having an input 26 and a multiplexer 34 having an output 36. Each of the multiplexed DRX paths A-N may comprise a pre-filter, a LNA, and a post-filter, such that path A includes pre-filter 28A, LNA 30A, and post-filter 32A; path B includes pre-filter 28N, LNA 30N, and post-filter 32N. As seen in FIG. 1B, a large number of filters and LNAs are required, since each path A-N has at least two filters and an LNA.

Figure 1C:
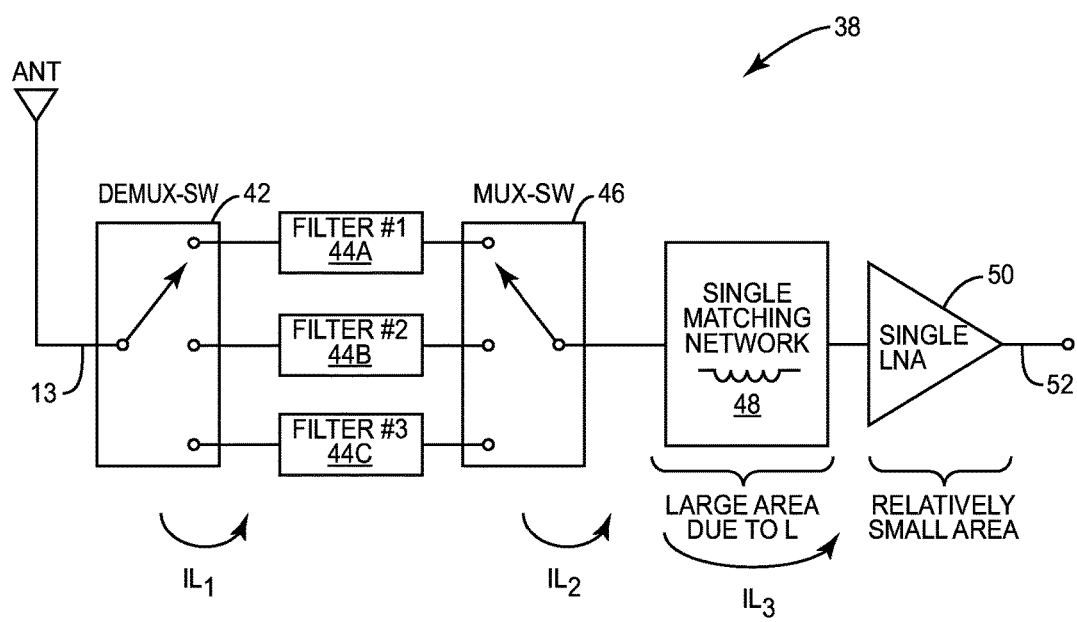
FIG. 1C illustrates an example of a DRX module using a single low noise amplifier (LNA) and a single matching network.

In one embodiment, the output multiplexer 34 may be omitted and the different signal path may be routed to different transceivers. One proposed DRX module may use a single LNA, as seen in FIG. 1C, to reduce the number of matching inductors, to avoid a larger area and higher costs associated with the larger number of filters and LNAs. In the DRX module 38 shown in FIG. 1C, a signal from antenna 40 is input into a demultiplexer-switch 42, which switches between filters 44A, 44B, and 44C. A multiplexer-switch 46 then selects between the outputs of the filters 44A, 44B, and 44C, and sends the selected output to a single matching network 48 and then to a single LNA 50 having an output 52. By using a single LNA, as shown in FIG. 1C, the number of matching inductors can be reduced, avoiding higher costs associated with a larger number of inductors, as well as avoiding a larger area being required. However, the pre-LNA circuitry still degrades the NF. It has wider bandwidth and thus lower loaded Q factor. To avoid the disadvantages of the above disclosed DRX modules, it is proposed to use a shared tunable notch filter that will reject the transmit blocker for all diversity receive paths simultaneously. Since carrier aggregation DRX modules require keeping two or more receive paths active, and in the traditional DRX modules, each band has a dedicated fixed frequency filter, this results in a large filter count/size/cost. For example, using three dedicated tunable notch filters to achieve carrier aggregation of low-band, mid-band, and high-band frequencies, up to nine inductors and third order filters may be needed. This is not competitive in terms of area or costs. The inventors of this application made the observation that the hard transmit blocker rejection comes from the self transmit (TX 1) for all receive (RX) bands, and thus separate notch-band-pass filters are not needed for each receive (RX) path. By using a shared tunable notch filter (2×2 L) with an optional matching network in each path (3×1 L), only seven inductors total are needed.

In certain embodiments, a single tunable notch filter may not be enough to cover low-band, mid-band, and high-band frequencies. This is due to a maximum tuning of fifteen to twenty percent (15%-20%) per tunable notch filter. In this embodiment, two or more tunable notch filters may be needed. For example, one tunable notch filter may be used for the low-band, and a second tunable notch filter may be used for the mid-band and high-band. In one embodiment, matching networks may be used for LNA impedance transformation and bias. The LNA matching network may provide differential resonance. The advantage of the shared tunable notch filter disclosed herein increases with the count of signal paths.

The shared tunable notch filter can be placed either before or after the LNA, depending on the needs or desired characteristics of the specific receive sub-module. The principle of the shared tunable notch filter can be seen in FIGS. 2A and 2B.

Figure 2A:
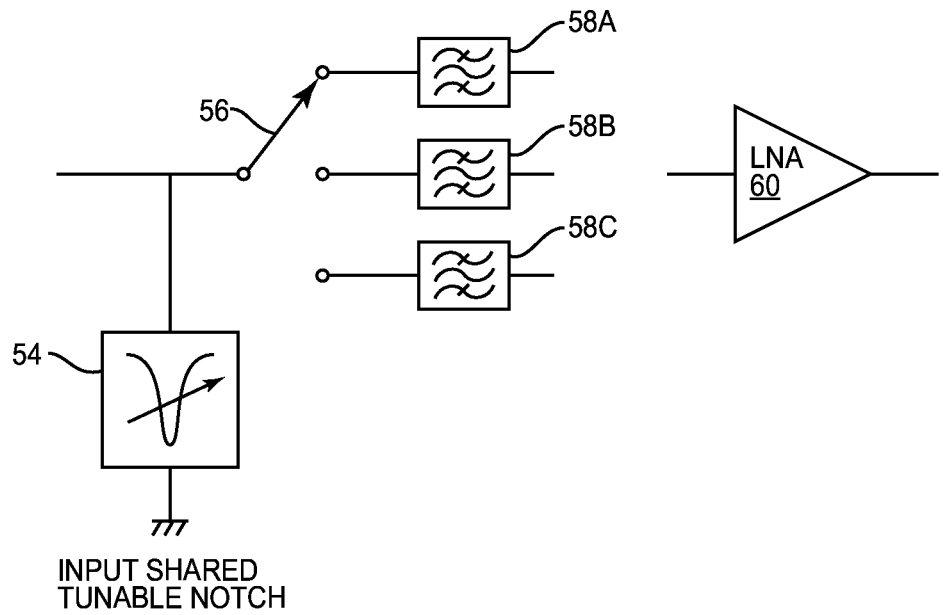
FIG. 2A illustrates an exemplary embodiment of a shared tunable notch filter positioned before a single LNA.

Referring to FIG. 2A, a shared tunable notch filter 54 is shown positioned before a single LNA, and may be referred to as an input shared tunable notch filter. A switch 56 selects one of filters 58A, 58B, or 58C, each of which is selectably coupled to LNA 60. In one embodiment, each filter may have a dedicated LNA, avoiding the need for switching. Placing the shared tunable notch filter 54 before the LNA reduces the signal swing seen by the LNA and provides less linearity/lower bias current, but results in higher NF due to loss before the first gain stage.

Figure 2B:
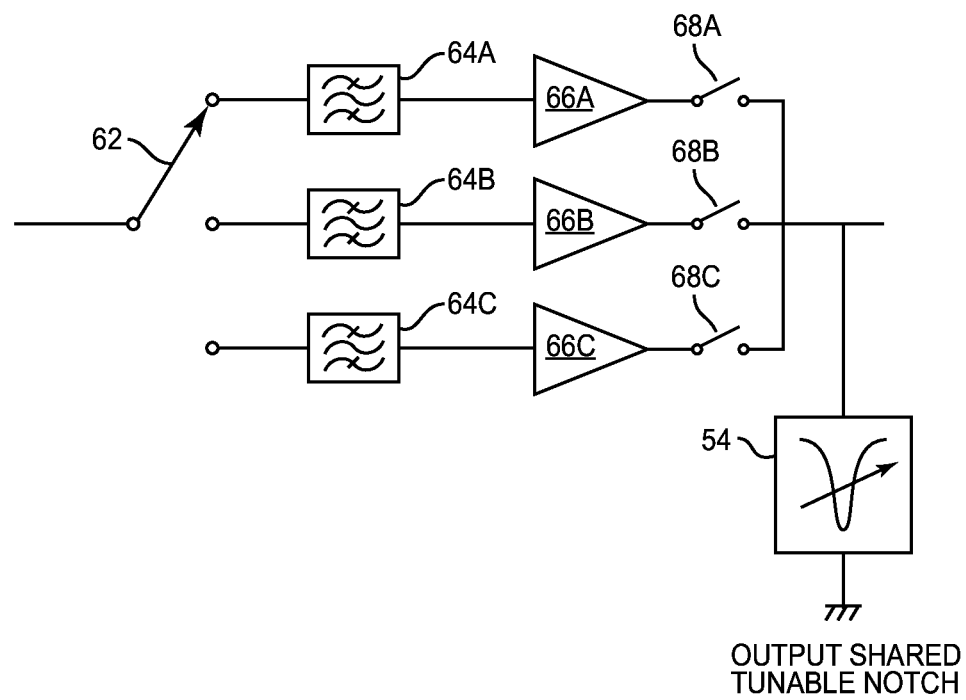
FIG. 2B illustrates an exemplary embodiment of a shared tunable notch filter positioned after a single LNA.

Referring to FIG. 2B, a shared tunable notch filter 54 is shown positioned after one or more LNAs, and may be referred to as an output shared tunable notch filter. A switch 62 selects one of filters 64A, 64B, or 64C, which are coupled to LNAs 66A, 66B, and 66C, respectively. Each LNA 66A, 66B, and 66C are selectively coupled through respective switches 68A, 68B, and 68C to the output shared tunable notch filter 54. Placing the shared tunable notch filter 54 after the LNAs results in lower NF since loss after gain stage has less impact on NF, but the LNA is exposed to a larger signal level and provides higher linearity requirements/higher bias current.

In one embodiment, the outputs of the multiple LNAs 66A, 66B, and 66C are multiplexed and thus avoid the need for the switches 68A, 68B, and 68C.

In both FIGS. 2A and 2B, the use of the shared tunable notch filter 54 allows the filters 58A-58C or 64A-64C to be simpler, less complex filters, which further saves costs. In this manner, the shared tunable notch filter 54 relaxes the requirements of the individual band-pass network for each of the receive paths.

Figure 3:
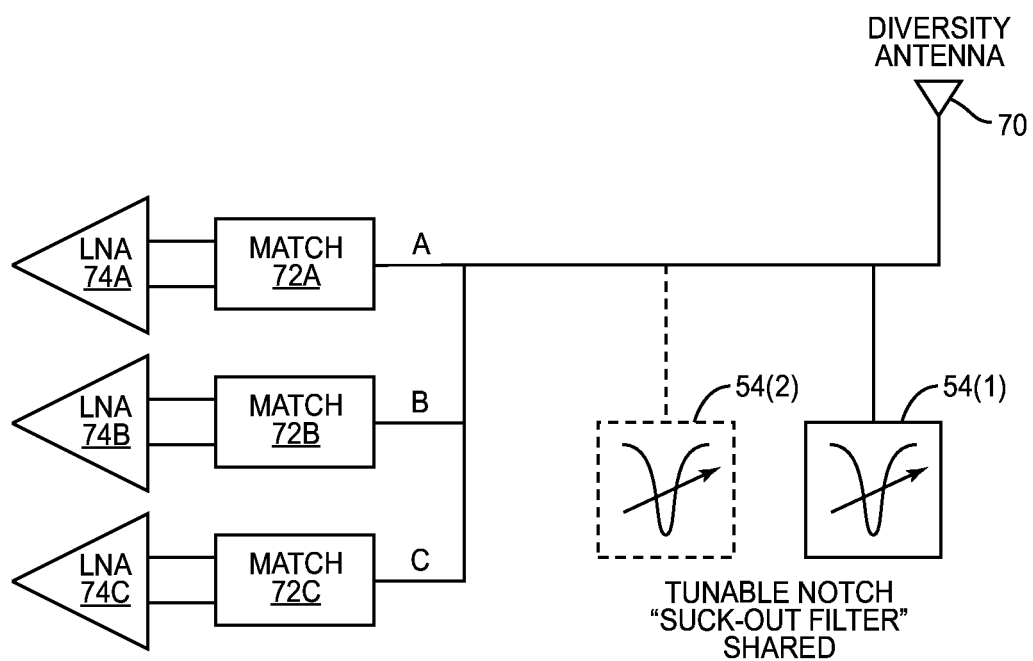
FIG. 3 illustrates an exemplary embodiment of a pre-LNA shared tunable notch filter for a multi-path receive sub-module.

This is also shown in FIG. 3, which is an exemplary embodiment of a pre-LNA shared tunable notch filter for a multi-path receive sub-module, where the specifications for the RX filters are relaxed. In FIG. 3, one or more shared tunable notch filters 54(1), 54(2) are placed between the diversity antenna 70 and the respective LNAs in the receive paths A, B, and C. Each of the receive paths A, B, and C has a respective matching network 72A, 72B, or 72C, and an associated LNA 74A, 74B, or 74C. Due to the one or more shared tunable notch filters 54(1) and 54(2), simpler and less complex filters with less demanding specifications may be used.

As discussed above, in one embodiment, a single shared tunable notch filter 54(1) may be used to handle low-band, mid-band, and high-band frequencies. In another embodiment, multiple shared tunable notch filters 54(1) and 54(2) may be used, and one of the shared tunable notch filters 54(1) and 54(2) may handle low-band frequencies and the other shared tunable notch filter 54(1) or 54(2) may handle the mid-band and high-band frequencies.

In one embodiment, two or more shared tunable notch filters can be used to reject two or more transmit blocker signals, as is the case for up-link carrier aggregation.

The disclosed shared tunable notch filter 54(1) or 54(2) may take any of a number of forms, as seen in FIGS. 4A-4D and 5A-5C. In one embodiment, the shared tunable notch filter may serve as a "suck-out" band reject filter. FIGS. 4A-4D show exemplary embodiments of LC tunable notch filter implementations. FIG. 4A shows a LC tunable notch filter 76 that is capacitive coupled. With capacitive coupling, there is minimal loading of the main line (multiple notches). The LC tunable notch filter 76 comprises a capacitor 78 coupled to a first LC resonator 79 comprising inductor 80 and capacitor 82, which in turn is weakly coupled to a second LC resonator 83 comprising capacitor 84 and inductor 86. The LC tunable notch filter 76 also comprises capacitor 88 and resistance 90. A weakly-coupled filter creates a narrow-band energy "dump-path" for the transmit blocker.

FIG. 4B shows a LC tunable notch filter 92 that is multi-capacitive coupled. The LC tunable notch filter 92 comprises a pair of capacitors 94, 96, each coupled to a respective LC resonator. First, a first capacitor 94 is coupled to a first LC resonator 97 comprising inductor 98 and capacitor 100. A second capacitor 96 is coupled to a second LC resonator 101 comprising inductor 102 and capacitor 104. The first LC resonator 97 is weakly coupled to the second LC resonator 101. The LC tunable notch filter 92 also comprises capacitor 106 and resistance 108.

FIG. 4C shows a LC tunable notch filter 110 that is inductive coupled. With inductive coupling, an additional inductor is required. An inductor 112 is weakly coupled to a first LC resonator 113 comprising an inductor 114 and a capacitor 116. The first LC resonator 113 is coupled to a second LC resonator 117 comprising an inductor 118 and a capacitor 120. The LC tunable notch filter 110 also comprises capacitor 122 and resistance 124.

FIG. 4D shows a LC tunable notch filter 126 that is resonant coupled. With resonant coupling, all inductors participate to the filtering function. A first LC resonator 127 comprising an inductor 128 and a capacitor 130 is weakly coupled to a second LC resonator 131 comprising an inductor 132 and a capacitor 134. The LC tunable notch filter 126 also comprises capacitor 136 and resistance 138.

Figure 5C:
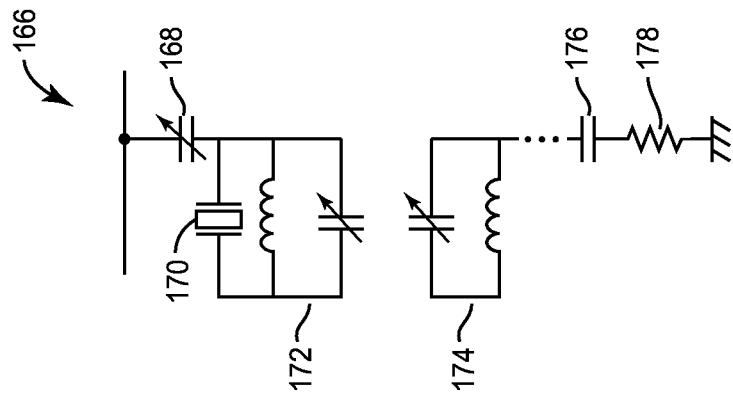
FIGS. 5A-5C illustrate exemplary embodiments of a shared tunable notch filter using hybrid weakly-coupled and acoustic structures.
Figure 5B:
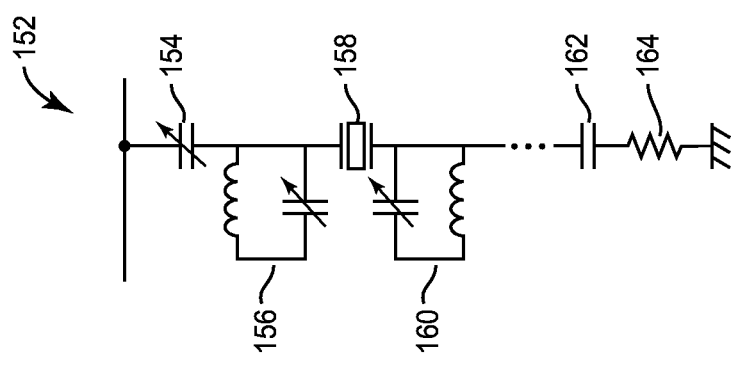
Figure 5A:
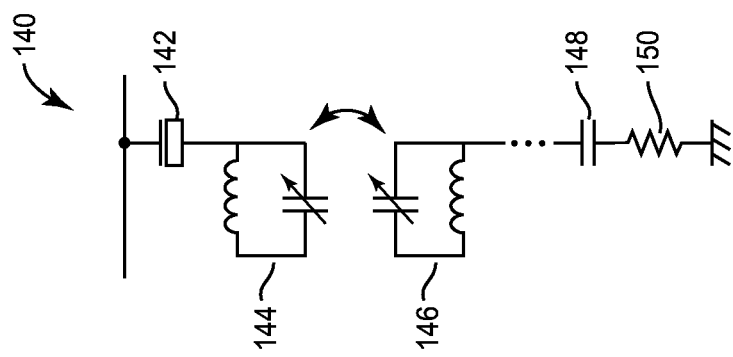

FIGS. 5A-5C show exemplary embodiments of shared tunable notch filters using hybrid weakly-coupled and acoustic structures. FIG. 5A shows an exemplary shared tunable notch filter 140 comprising an acoustic structure 142 coupled to a tunable LC resonator 144, which in turn is weakly coupled to a second tunable LC resonator 146. The shared tunable notch filter 140 also comprises capacitor 148 and resistance 150.

FIG. 5B shows an exemplary shared tunable notch filter 152 comprising a tunable capacitance 154 coupled to a first tunable LC resonator 156. The first tunable LC resonator 156 is coupled to an acoustic structure 158, which in turn is coupled to a second tunable LC resonator 160. The shared tunable notch filter 152 also comprises capacitor 162 and resistance 164.

FIG. 5C shows an exemplary shared tunable notch filter 166 comprising a tunable capacitance 168 coupled to an acoustic structure 170 in parallel with a first tunable LC resonator 172. The first tunable LC resonator 172 is resonantly coupled to a second tunable LC resonator 174. The shared tunable notch filter 166 also comprises capacitor 176 and resistance 178.

Based on the above disclosed implementations of the shared tunable notch filter, it can be seen that a tunable stop band filter (TSBF) can be used to eliminate TX self-interference at one frequency. In another embodiment, a single stage tunable medium Q band pass matching network (TMBP) can be used. In still another embodiment, multiple TMBP's can be attached to a single TSBF to form a diversity LNA.

In one embodiment, the LNAs are also associated with a matching network for optimal noise performance (higher noise impedance), as is the case for FET (field effect transistor) implementations. In addition, the matching network is often used for biasing the LNAs. In one embodiment, the moderate Q of the matching networks provide some amount of band-pass filtering which is sufficient for the DRX applications (no need of individual band-pass-filter for each LNA path). In this embodiment, the receive sub-module needs only the disclosed shared tunable notch filter and the matching networks for each LNA. This particular embodiment can be also seen as a receive-filter-less DRX architecture.

Figure 6:
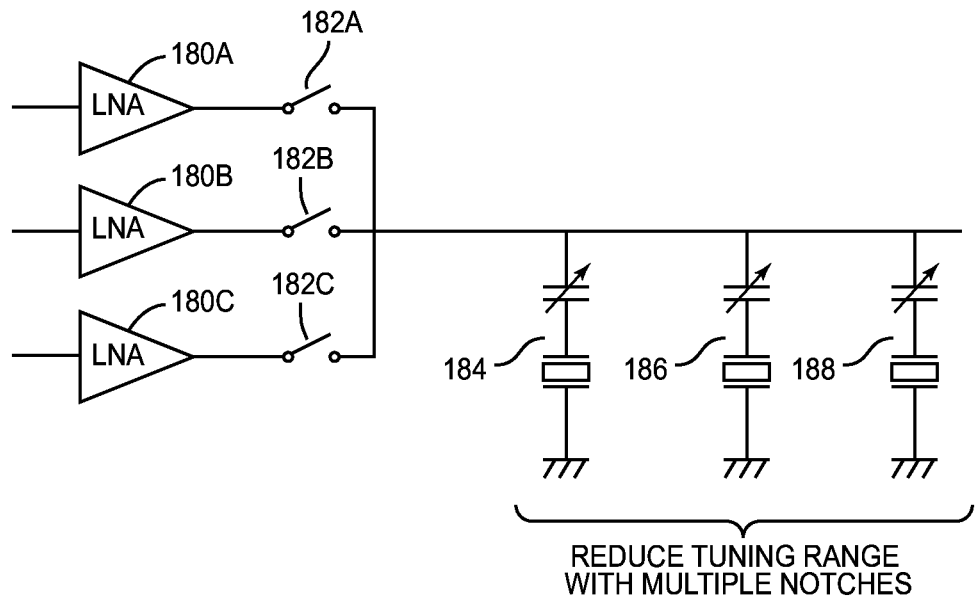
FIG. 6 illustrates an exemplary embodiment where multiple shared tunable notch filters are placed at the LNA output.

FIG. 6 shows an exemplary embodiment where multiple shared tunable notch filters are placed at the LNA output. In this embodiment, there is both electrical switch combining and electrical tunable notch filters with acoustic resonators. LNAs 180A, 180B, and 180C are each electrically switched through respective switches 182A, 182B, and 182C to multiple electrically shared tunable notch filters 184, 186, and 188 with acoustic resonators. By including the multiple shared tunable notch filters, the tuning range of each shared tunable notch filter is reduced such that each of the shared tunable notch filters 184, 186, and 188 are only responsible for a smaller tuning range than if there was a single tunable notch filter. In one embodiment, the outputs of the LNAs 180A, 180B, and 180C may be multiplexed instead of being switched.

Figure 7:
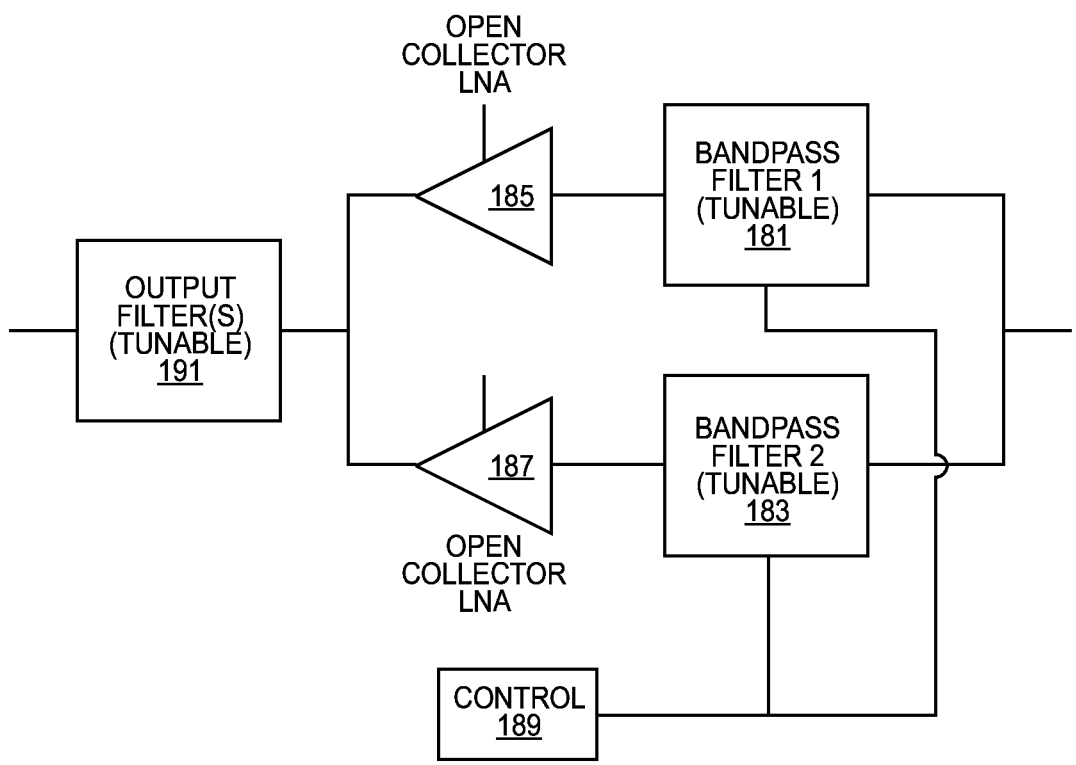
FIG. 7 illustrates an exemplary embodiment where there is magnetic coupling at the LNA output.

FIG. 7 shows an embodiment where there is magnetic coupling at the LNA output. A tunable band-pass filter 1 181 and a tunable band band-pass filter 2 183 are provided and are coupled to open collector LNAs 185 and 187, as well as control block 189. Control block 189 controls and tunes both tunable band-pass filter 1 181 and tunable band-pass filter 2 183. Tunable output filter(s) 191 may also be coupled to the output of the open collector LNAs 185 and 187 to provide magnetic coupling at the LNA output. In one embodiment, the tunable band-pass filter 1 181 may handle mid-band frequencies, and the tunable band-pass filter 2 183 may handle high-band frequencies.

Figure 8:
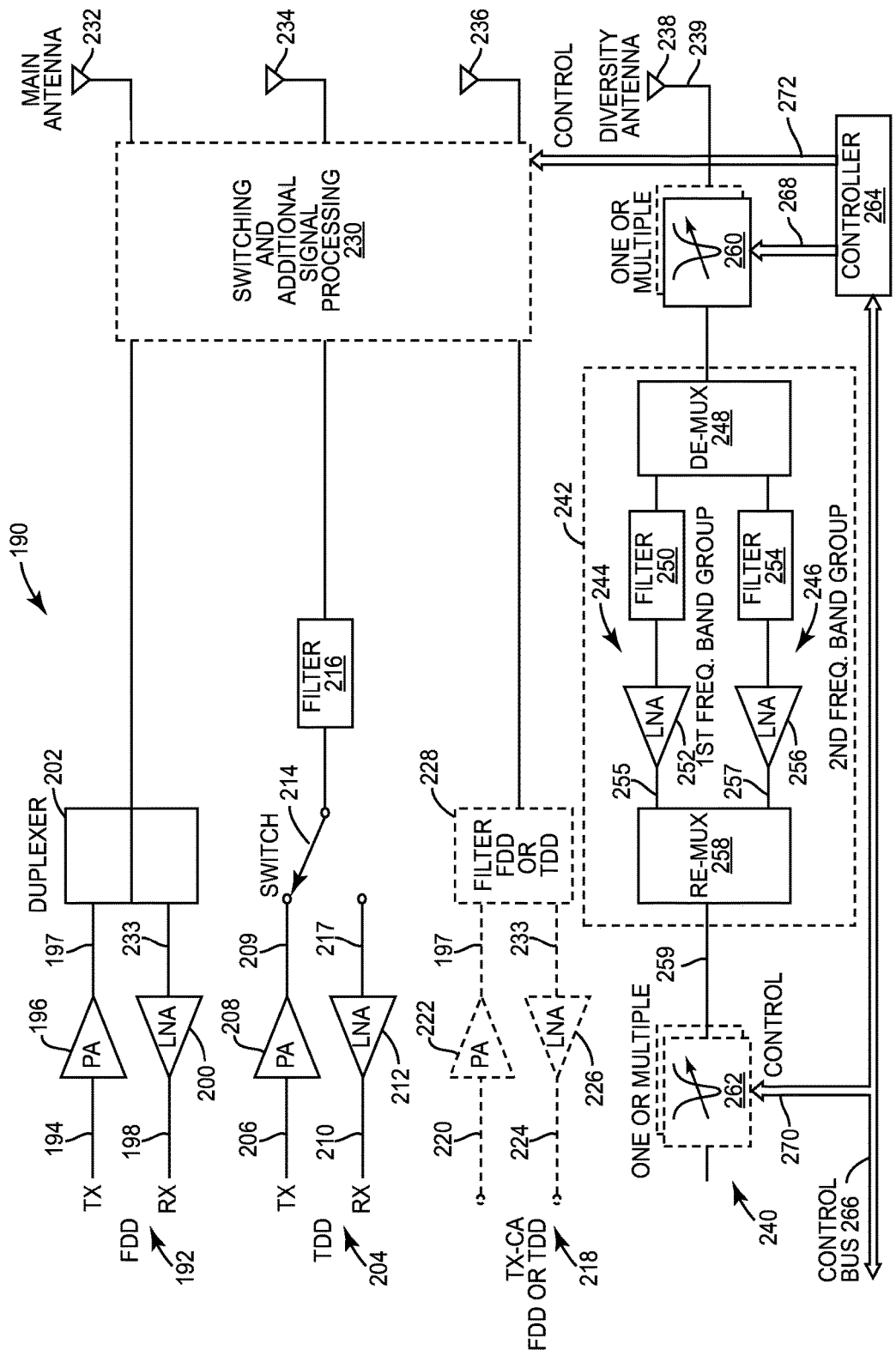
FIG. 8 shows an exemplary embodiment of a system in which a shared tunable notch filter can be used in a receive sub-module having at least two diversity receive paths, wherein the receive sub-module comprises at least one shared tunable notch filter configured to reject the transmit blocker for all diversity receive paths.

FIG. 8 shows an exemplary system 190 in which a shared tunable notch filter can be used in a receive sub-module having at least two diversity receive paths, wherein the receive sub-module comprises at least one shared tunable notch filter configured to reject the transmit blocker for all, or a subset of, the diversity receive paths simultaneously. The exemplary system 190 may include a front end module such as a Frequency Division Duplex (FDD) transmit/receive (TX/RX) module 192. The FDD TX/RX module 192 may have a transmit path where a FDD TX signal 194 is input into a power amplifier 196 and then the amplified FDD TX signal 197 is provided to a duplexer 202. The FDD TX/RX module 192 may also have a receive path 198 for receiving a signal. The receive path 198 may include a LNA 200. The duplexer 202 may forward the amplified FDD TX signal 197 to a main antenna 232 via switching and additional signal processing block 230. The duplexer 202 may also receive and forward a FDD RX signal 233 from the main antenna 232 via the switching and additional signal processing block 230 to the LNA 200.

Still referring to FIG. 8, the exemplary system 190 may include another front end module such as a Time Division Duplex (TDD) transmit/receive (TX/RX) module 204. The TDD TX/RX module 204 may have a transmit path where a TDD TX signal 206 is input into a power amplifier 208 and then the amplified TDD TX signal 209 is provided to a switch 214 which selectively switches between the transmit path and a receive path 210. During transmission, the switch 214 is selectively connected to a filter 216, and the amplified TDD TX signal 209 is forwarded to an antenna 234 via the switching and additional signal processing block 230. The TDDTX/RX module 204 may also receive and forward a TDD RX signal 217 from the antenna 234 via the switching and additional signal processing block 230 and the filter 216, where the filter is switched to the receive path 210. The TDD RX signal 217 may be passed through an LNA 212.

Still referring to FIG. 8, the exemplary system 190 may optionally include one or more additional front end modules, such as in the case of carrier aggregation. Such a module may be referred to as a TX-CA module 218. The TX-CA module 218 may be either a FDD or a TDD module, and may include a transmit path 220 that includes a power amplifier 222 and a receive path 224 that includes an LNA 226. The TX-CA module 218 may also include a filter 228, and operates in a similar manner as the FDD TX/RX module 192 or the TDD TX/RX module 204 to provide a transmit signal to, and receive a receive signal from, an associated antenna 236 via the switching and additional signal processing block 230.

With continued reference to FIG. 8, one or more of the transmit signals transmitted to the antennas 232, 234, and/or 236 by the front end modules 192, 204, and/or 218, may be received by diversity antenna 238 and forwarded to a DRX module 240. The DRX module 240 may include a portion 242 that comprises at least two receive paths, a first receive path 244 and a second receive path 246. Though the embodiment in FIG. 8 shows two receive paths, more than two receive paths may be present, depending on the number of front end modules and/or the number of carriers. In one embodiment, the first receive path 244 may receive and process a first set of signals, such as signals in a first frequency band group, while the second receive path 246 may receive and process a second set of signals, such as signals in a second frequency band group. For example, in one embodiment, the first receive path 244 may receive and process low-band frequency signals, while the second receive path 246 may receive and process mid-band and high-band frequency signals. The first set of signals received by the first receive path 244 includes at least desired one receive signal and at least one undesired transmit blocker signal from one or more of the transmit modules. The second set of signals received by the second receive path 246 includes at least one desired receive signal and at least one undesired transmit blocker signal from one or more of the transmit modules.

With continued reference to FIG. 8, the signals 239 received at the diversity antenna 238 are provided to a demultiplexer 248, which provides the received signal to one of the receive paths 244 or 246. The first receive path 244 includes a filter 250 and an LNA 252. The second receive path 246 includes a filter 254 and an LNA 252. A remultiplexer 258 then takes processed signals 255 and 257 from the first receive path 244 and the second receive path 246, respectively, and provides an output receive signal 259. In one embodiment, the demultiplexer 248 and/or the remultiplexer 258 may be replaced with switches.

In one embodiment, as seen in FIG. 8, at least one shared tunable notch filter 260 may be placed between the diversity antenna 238 and the two or more receive paths 244 and 246, and before LNAs 252 and 256 in the first and second receive paths 244 and 246. The at least one shared tunable notch filter 260 is configured to reject at least one of the undesired transmit blocker signals for all, or a subset of, the diversity receive paths simultaneously. Accordingly, the at least one shared tunable notch filter 260 will reject at least one of the undesired transmit blocker signals for both the first receive path 244 and the second receive path 246. In one embodiment, the at least one shared tunable notch filter 260 is tuned to the known frequency of the transmit signal from one of the FDD TX/RX module 192, the TD TX/RX module 204, or the TX-CA module 218. In another embodiment, there are multiple shared tunable notch filters 260. For example, where a single tunable notch filter 260 may not be enough to cover low-band, mid-band, and high-band frequencies. Thus, in one embodiment, two or more tunable notch filers 260 may be used. For example, one tunable notch filter 260 may be used for the low-band frequencies, and a second tunable notch filter 260 may be used for the mid-band and high-band frequencies.

In one embodiment, multiple shared tunable notch filters can be used to reject multiple transmit blocker signals that are active simultaneously, as is the case for up-link carrier aggregation.

In the embodiment shown in FIG. 8, at least one shared tunable notch filter 262 may also be placed after the LNAs 252 and 256 in the first and second receive paths 244 and 246. The at least one shared tunable notch filter 262 placed after the LNAs 252 and 256 in the first and second receive paths 244 and 246 may be used instead of the at least one shared tunable notch filter 260 in one embodiment, or in a different embodiment, the at least one shared tunable notch filter 262 placed after the LNAs 252 and 256 in the first and second receive paths 244 and 246 may be used in combination with the at least one shared tunable notch filter 260 placed before the LNAs 252 and 256.

The at least one shared tunable notch filter 262 in FIG. 8 is configured to reject the transmit blocker for all diversity receive paths simultaneously. Accordingly, the at least one shared tunable notch filter 262 will reject the transmit blocker for both the first receive path 244 and the second receive path 246. In one embodiment, the at least one shared tunable notch filter 262 is tuned to the known frequency of the transmit signal from one of the FDD TX/RX module 192, the TDD TX/RX module 204, or the TX-CA module 218. In another embodiment, there are multiple shared tunable notch filters 262. For example, where a single tunable notch filter 262 may not be enough to cover low-band, mid-band, and high-band frequencies. Thus, in one embodiment, two or more tunable notch filers 262 may be used. For example, one tunable notch filter 262 may be used for the low-band frequencies, and a second tunable notch filter 262 may be used for the mid-band and high-band frequencies.

Referring again to FIG. 8, a controller 264 may be used to selectively control the at least one shared tunable notch filter 260 directly or via a control bus 266 by control signal 268. If the at least one shared tunable notch filter 262 is placed after the LNAs 252 and 256, the controller 264 may also control the at least one shared tunable notch filter 262 via a control signal 270 communicated on the control bus 266. The controller 264 may also provide communication and control signals 272 to the switching and additional signal processing block 230.

Testing on the DRX diversity modules having the shared tunable notch filter have shown that the shared tunable notch filter is able to effectively block the TX blocker for all diversity RX paths simultaneously while providing reasonable Q and sizable band-pass rejection and keeping the noise contribution of the LNAs low. In particular, in one embodiment, using a weakly-coupled LC resonator as the shared tunable notch filter results in high transmit blocker rejection and low insertion loss impact in the LNA pass-band due to the negligible reflectivity of the weakly coupled filters. In addition, the weakly coupled nature of the shared tunable notch filter ensures a very low level of interaction between the TX notch and the band-pass filtering section of the filters, allowing for a wide range tunability of each component. Further, the band-pass LNA matching networks can be tunable and cover several adjacent bands. By using the shared tunable notch filter and a tunable matching network, the diversity DRX module can address a wide variety of channel carrier aggregation combination with a small hardware infrastructure.

In addition, test results indicate that tuning the band-pass portion has virtually no impact on the notch provided by the shared tunable notch filter. Even where an upper band-pass filter is tuned to come lower than a notch provided by the shared tunable notch filter, the notch is not negatively impacted. Accordingly, to close by receive (RX) channels can be realized via appropriate tuning. Likewise, test results indicate that tuning the shared tunable notch filter does not negatively impact the band-pass transfer functions.

Those skilled in the art will recognize improvements and modifications to the present disclosure. All such improvements and modifications are considered within the scope of the concepts disclosed herein.

What is claimed is:

1. A carrier aggregation front-end module for receiving multiple signals from a plurality of transmit modules, wherein the received multiple signals are received at a plurality of frequency bands, each having its own receive path, the carrier-aggregation front-end module comprising:
   a receive sub-module having a first receive path and a second receive path, wherein:
      the first receive path is configured to receive a first set of signals, from one or more of a plurality of antennas, wherein the first set of signals comprises at least one first desired receive signal in a first receive frequency band and at least one undesired transmit blocker signal from a plurality of transmit modules, wherein the at least one undesired transmit blocker signal has a first frequency different than a frequency of the at least one first desired receive signal;
      the second receive path is configured to receive a second set of signals from one or more of the plurality of antennas, wherein the second set of signals comprises at least one second desired receive signal in a second receive frequency band and the at least one undesired transmit blocker signal from a plurality of transmit modules, wherein the at least one undesired transmit blocker signal in the second receive path has the same first frequency as the at least one undesired transmit blocker signal in the first receive path; and
   at least one shared tunable notch filter configured to receive the first set of signals intended for the first receive path and the second set of signals intended for the second receive path and to reject the at least one undesired transmit blocker signal having the same first frequency for each of the first receive path and the second receive path, wherein a controller is configured to selectively control the at least one shared tunable notch filter.

2. The carrier aggregation front-end module of claim 1, wherein at least one of the first receive path and the second receive path comprises a low noise amplifier (LNA).

3. The carrier aggregation front-end module of claim 2, wherein the at least one shared tunable notch filter is implemented at an input of the LNA.

4. The carrier aggregation front-end module of claim 2, wherein the at least one shared tunable notch filter is implemented at an output of the LNA.

5. The carrier aggregation front-end module of claim 4, further comprising a multiplexer, and wherein multiplexing at the output of the LNA is realized magnetically.

6. The carrier aggregation front-end module of claim 4, further comprising a multiplexer, and wherein multiplexing at the output of the LNA is realized electrically.

7. The carrier aggregation front-end module of claim 1, wherein the at least one shared tunable notch filter comprises multiple shared tunable notch filters for up-link carrier aggregation or MIMO (multiple input multiple output) applications.

8. The carrier aggregation front-end module of claim 1, wherein each of the first receive path and the second receive path comprises an individual matching network for the respective first or second receive path.

9. The carrier aggregation front-end module of claim 1, wherein the at least one shared tunable notch filter comprises at least one weakly-coupled resonator.

10. The carrier aggregation front-end module of claim 1, wherein each of the first receive path and the second receive path comprises an individual band-pass network.

11. The carrier aggregation front-end module of claim 1, wherein the first set of signals comprises a first frequency band group of signals and the second set of signals comprises a second frequency band group of signals.

12. The carrier aggregation front-end module of claim 11, wherein the first frequency band group of signals comprises low-band frequency signals and the second frequency band group of signals comprises mid-band frequency signals and high-band frequency signals.

13. The carrier aggregation front-end module of claim 11, wherein the at least one shared tunable notch filter comprises multiple shared tunable notch filters, and a first one of the multiple shared tunable notch filters is configured to reject a transmit blocker signal in the first frequency band group of signals, and a second one of the multiple shared tunable notch filters is configured to reject a transmit blocker signal in the second frequency band group of signals.

14. The carrier aggregation front-end module of claim 1, wherein the carrier aggregation front-end module comprises both receive and transmit signal paths.

15. A system for providing carrier aggregation comprising:
   a plurality of transmit modules, each of the plurality of transmit modules associated with a main antenna and configured to transmit multiple transmit signals via its associated main antenna at a plurality of frequency bands, each having its own receive path, the multiple transmit signals comprising at least one undesired transmit blocker signal, the at least one undesired transmit blocker signal having a frequency;
   a diversity antenna configured to receive the multiple transmit signals from the plurality of transmit modules; and
   a receive sub-module configured to receive one or more of the multiple transmit signals from the plurality of the transmit modules, wherein the receive sub-module comprises:
      a first receive path configured to receive a first set of signals from the diversity antenna, wherein the first set of signals comprises at least one first desired receive signal having a first frequency in a first receive frequency band and the at least one undesired transmit blocker signal from the plurality of transmit modules, wherein the first frequency of the at least one first desired receive signal is different than the frequency of the at least one undesired transmit blocker signal;

a second receive path configured to receive a second set of signals from the diversity antenna, wherein the second set of signals comprises at least one second desired receive signal having a second frequency in a second receive frequency band and the at least one undesired transmit blocker signal from the plurality of transmit modules, wherein the second frequency of the at least one second desired receive signal is different than the frequency of the at least one undesired transmit blocker signal, and wherein the at least one undesired transmit blocker signal in the second receive path has the same frequency as the undesired transmit blocker signal in the first receive path;

at least one shared tunable notch filter configured to receive the first set of signals intended for the first receive path and the second set of signals intended for the second receive path and to reject the at least one undesired transmit blocker signal having the same frequency for each of the first receive path and the second receive path; and a controller configured to selectively control the at least one shared tunable notch filter.

16. The system of claim 15, wherein the at least one shared tunable notch filter comprises at least one weakly-coupled resonator.

17. The system of claim 15, wherein at least one of the first receive path and the second receive path comprises a low noise amplifier (LNA).

18. The system of claim 17, wherein the at least one shared tunable notch filter is implemented at an input of the LNA.

19. The system of claim 17, wherein the at least one shared tunable notch filter is implemented at an output of the LNA.

20. The system of claim 15, wherein the at least one shared tunable notch filter comprises multiple shared tunable notch filters, and a first one of the multiple shared tunable notch filters is configured to reject a first transmit blocker signal in a first frequency band group of signals, and a second one of the multiple shared tunable notch filters is configured to reject a second transmit blocker signal in a second frequency band group of signals, wherein the first and second transmit blocker signals can be active simultaneously or one at a time.

* * * * *